(12) United States Patent
Kim

(10) Patent No.: US 7,602,661 B2
(45) Date of Patent: Oct. 13, 2009

(54) SEMICONDUCTOR MEMORY APPARATUS AND METHOD OF CONTROLLING THE SAME

(75) Inventor: Saeng-Hwan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 114 days.

(21) Appl. No.: 11/819,868

(22) Filed: Jun. 29, 2007

(65) Prior Publication Data

US 2008/0043549 A1   Feb. 21, 2008

(30) Foreign Application Priority Data

Aug. 16, 2006   (KR) ................. 10-2006-0076946

(51) Int. Cl.
G11C 7/00 (2006.01)
G11C 29/00 (2006.01)
(52) U.S. Cl. .............. 365/200; 365/191; 365/222; 365/230.06
(58) Field of Classification Search ........... 365/191, 365/200, 222
See application file for complete search history.

(56) References Cited

U.S. PATENT DOCUMENTS

| 6,865,132 | B2 | 3/2005 | Schaefer et al. | |
| 6,956,777 | B2 * | 10/2005 | Komura et al. | 365/200 |
| 6,961,278 | B2 | 11/2005 | Jeong | |
| 6,990,032 | B2 | 1/2006 | Jang | |
| 7,187,607 | B2 * | 3/2007 | Koshikawa | 365/222 |
| 2002/0000581 | A1 | 1/2002 | Yamasaki | |
| 2003/0028712 | A1 * | 2/2003 | Horiguchi et al. | 711/106 |
| 2003/0107939 | A1 * | 6/2003 | Yoon et al. | 365/222 |
| 2004/0022110 | A1 * | 2/2004 | Haraguchi et al. | 365/222 |
| 2005/0265103 | A1 | 12/2005 | Remaklus, Jr. et al. | |

FOREIGN PATENT DOCUMENTS

| JP | 2002032986 | 1/2002 |
| JP | 2005216429 | 8/2005 |
| JP | 2006004558 | 1/2006 |
| KR | 10-1990-0015141 | 10/1990 |
| KR | 1020000005594 | 1/2000 |
| KR | 1020030047029 | 6/2003 |
| KR | 1020050068367 | 7/2005 |

* cited by examiner

*Primary Examiner*—Ly D Pham
(74) *Attorney, Agent, or Firm*—Venable LLP; Jeffri A. Kaminski

(57) ABSTRACT

A semiconductor memory apparatus configured to have general cells and redundant cells for repairing defective cells among the general cells includes; repair sets configured to determine whether general cells corresponding to input addresses are repaired or not and activate the redundant cells, decoding units configured to decode a refresh address or a normal address and activate the general cells or the redundant cells according to the decoded refresh address or normal address, and a control unit configured to perform control such that the addresses, which are output by the decoding units, are not input to the repair sets according to a control signal.

20 Claims, 5 Drawing Sheets

SEMICONDUCTOR MEMORY APPARATUS AND METHOD OF CONTROLLING THE SAME

CROSS-REFERENCE TO RELATED PATENT APPLICATION

This application claims the benefit of Korean Patent Application No. 10-2006-0076946, filed on Aug. 16, 2006, in the Korean Intellectual Property Office, the disclosure of which is incorporated herein in its entirety by reference.

BACKGROUND OF THE INVENTION

1. Technical Field

The present invention relates to a semiconductor memory apparatus, and more particularly, to a semiconductor memory apparatus and a method of controlling the same.

2. Related Art

Volatile semiconductor memory apparatuses cannot maintain original data levels because data values stored in memory cells (hereinafter, simply referred to as "cells") are changed as time passes. Therefore, a periodic refresh operation is essential to hold the data values that are stored in the cells.

Further, the semiconductor memory apparatus includes cell blocks, each of which includes a plurality of general cells, and redundant cells so as to repair defective cells among the general cells.

Therefore, a structure that determines whether or not to make the general cells or the redundant cells, which are used to repair the defective cells, active when the semiconductor memory apparatus operates in a normal state, that is, a repair set is necessarily prepared.

As shown in FIG. 1, a semiconductor memory apparatus according to the related art includes cell blocks 10, redundant cells 11, a refresh address counter 20, a pre-decoder 30, repair sets 40, and decoders 50.

The refresh address counter 20 counts a refresh address RA when a refresh signal REF is enabled.

The pre-decoder 30 pre-decodes the refresh address RA and a normal address NA that corresponds to a read or write command.

The refresh address RA is counted such that general cells in each of the cell blocks 10 can be sequentially activated.

The number of the repair sets 40 may vary according to a circuit design or the number of the redundant cells 11. In FIG. 1, some of the cell blocks 10 are shown among all of the cell blocks, and the redundant cells 11 are formed above and below each of the cell blocks 10. Therefore, two of the repair sets 40 are also formed at each of the cell blocks 10, for example.

As shown in FIG. 2, each of the repair sets 40 includes a first transistor M1 that has a source connected to a power supply terminal and a gate receiving a precharge signal PCG, a plurality of second transistors M2 that have gates individually receiving addresses A0 to An, which are output by the pre-decoder 30, a plurality of fuses F, each of which has one end connected to a drain of the first transistor M1 and the other end connected to a source of each of the plurality of second transistors M2, first and second inverters IV1 and IV2 that are connected to one end of the final fuse F among the plurality of fuses F, and a third transistor M3 that has a gate receiving output of the first inverter IV1, a source connected to the power supply terminal, and a drain connected to an input terminal of the first inverter IV1. When a defective cell is found among the cells of the cell blocks 10 and repaired using the redundant cell 11, the fuse F, which is connected to the second transistor M2, among the plurality of fuses F is removed. Here, the second transistor M2 receives an address (i.e., any one of the addresses A0 to An) of the repaired cell.

The repair set 40 precharges a node 1 with a high level according to the precharge signal PCG. A redundant enable signal REDEN remains enabled at a high level according to a latch operation of the first inverter IV1 and the third transistor M3. When the addresses A0 to An that are output by the pre-decoder 30 are not repaired, the corresponding fuses F are not cut off. Therefore, the node 1 is connected to a ground and thus the redundant enable signal REDEN is disabled at a low level.

Meanwhile, when the addresses A0 to An output by the pre-decoder 30 are repaired addresses, the corresponding fuses F are cut off. Therefore, the node 1 does not become a low level, and the redundant enable signal REDEN is maintained at a high level, that is, in an enabled state.

The redundant enable signal REDEN is output to the redundant cell 11. When the redundant enable signal REDEN is enabled, the corresponding redundant cell 11 becomes active.

The decoder 50 decodes the outputs of the pre-decoder 30 so as to generate row addresses, and outputs the row addresses to the cell block 11.

When the redundant enable signal REDEN is enabled, the decoder 50 does not allow the row addresses, which are obtained by decoding the outputs of the pre-decoder 30, to be output to the cell block 11.

The decoder 50 receives the same addresses as those of the repair set 40 and performs its operation. When the redundant enable signal REDEN is enabled, since the cells corresponding to the row addresses that the decoder 50 outputs are repaired using the redundant cells 11, the decoder 50 disables the row addresses.

As described above, the repair sets 40 always operate during a refresh operation as well as a normal operation.

The semiconductor memory apparatus according to the related art increases a refresh current because the repair sets always operate during the refresh operation. Further, the refresh current is one of the important factors that determine performance of the semiconductor memory apparatus. Therefore, the performance of the semiconductor memory apparatus may be lowered due to an increase in the refresh current.

SUMMARY OF THE INVENTION

Embodiments of the present invention provide a semiconductor memory apparatus and a method of controlling a semiconductor memory apparatus that can minimize a refresh current.

An embodiment of the present invention provides a semiconductor memory apparatus that has general cells and redundant cells for repairing defective cells among the general cells. The apparatus includes repair sets that determine whether general cells corresponding to input addresses are repaired or not and activate the redundant cells, decoding units that decode a refresh address or a normal address and activate the general cells or the redundant cells according to the decoded refresh address or normal address, and a control unit that performs control such that the addresses, which are output by the decoding units, are not input to the repair sets according to a control signal.

Another embodiment of the present invention provides a method of controlling a semiconductor memory apparatus that has a plurality of general cells, a plurality of redundant cells for repairing defective cells among the plurality of general cells, repair sets determining whether an input address is a repaired address or not, and decoders. The method includes determining whether a refresh signal is input or not, causing the address to be input to the repair sets and the decoders when the refresh signal is not input, such that an active operation is performed on the general cells and or the redundant cells, and blocking input of the address to the repair sets when the refresh signal is input and causing the address to be input to the decoders, such an active operation is performed on the general cells and the redundant cells.

DESCRIPTION OF EXEMPLARY EMBODIMENT

Embodiments of the present invention will now be described in detail with reference to the accompanying drawings.

Figure 1:
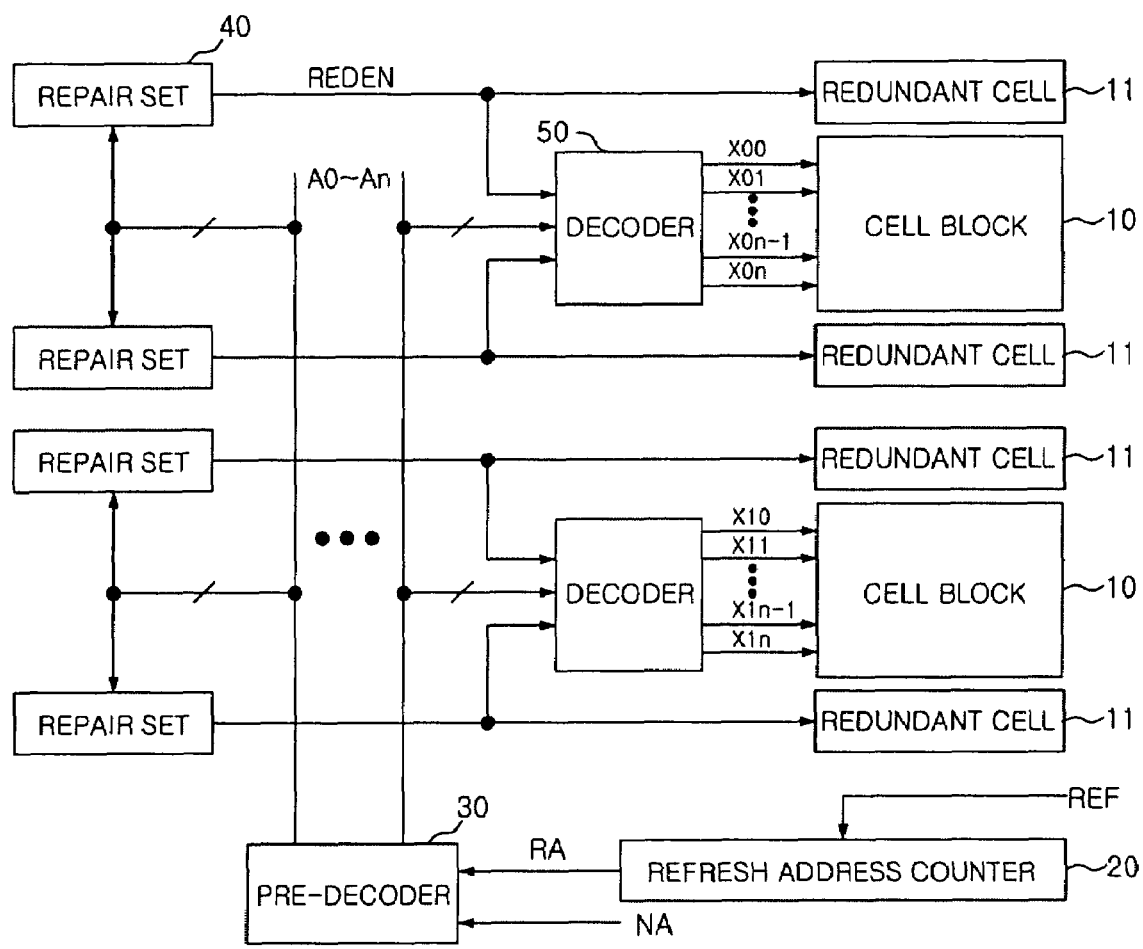
FIG. 1 is a block diagram illustrating a structure of a semiconductor memory apparatus according to the related art.
Figure 2:
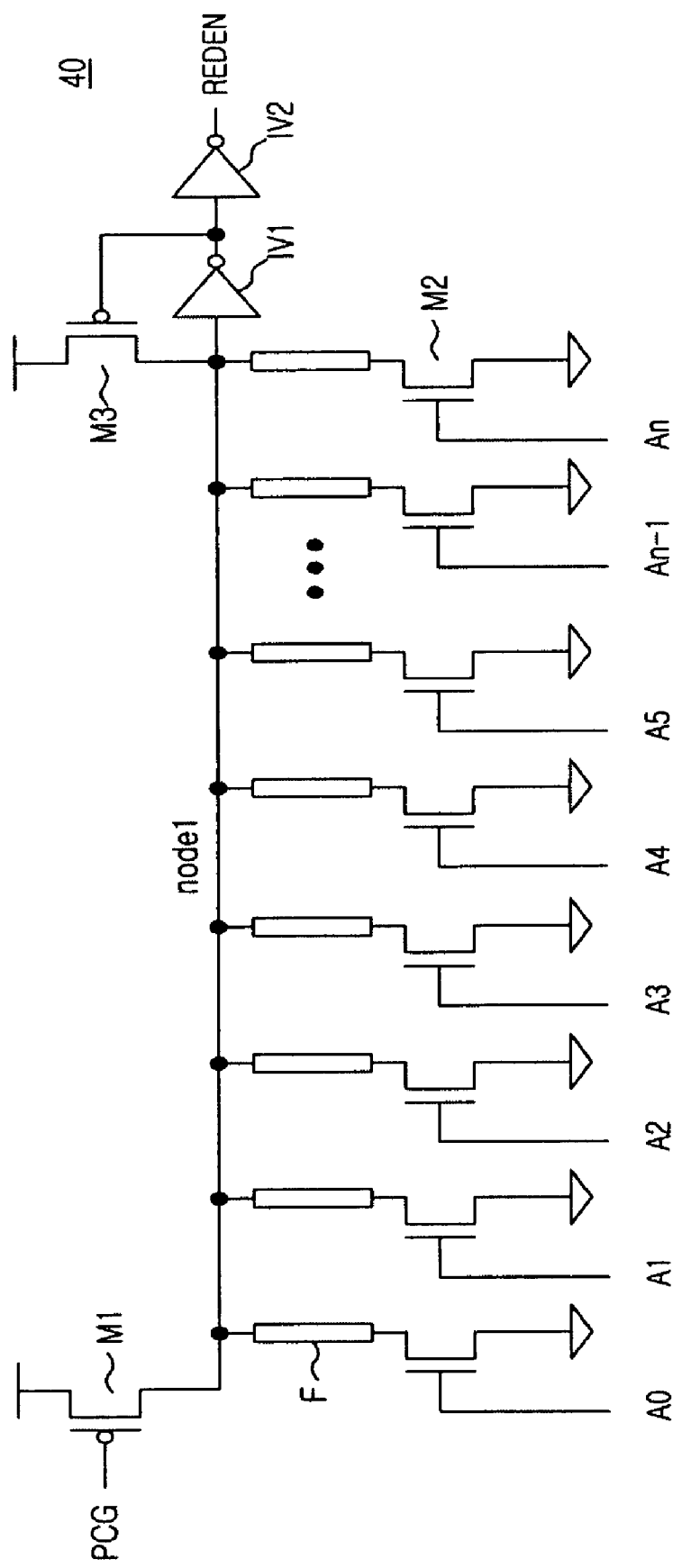
FIG. 2 is a circuit diagram illustrating a structure of a repair set of FIG. 1.
Figure 3:
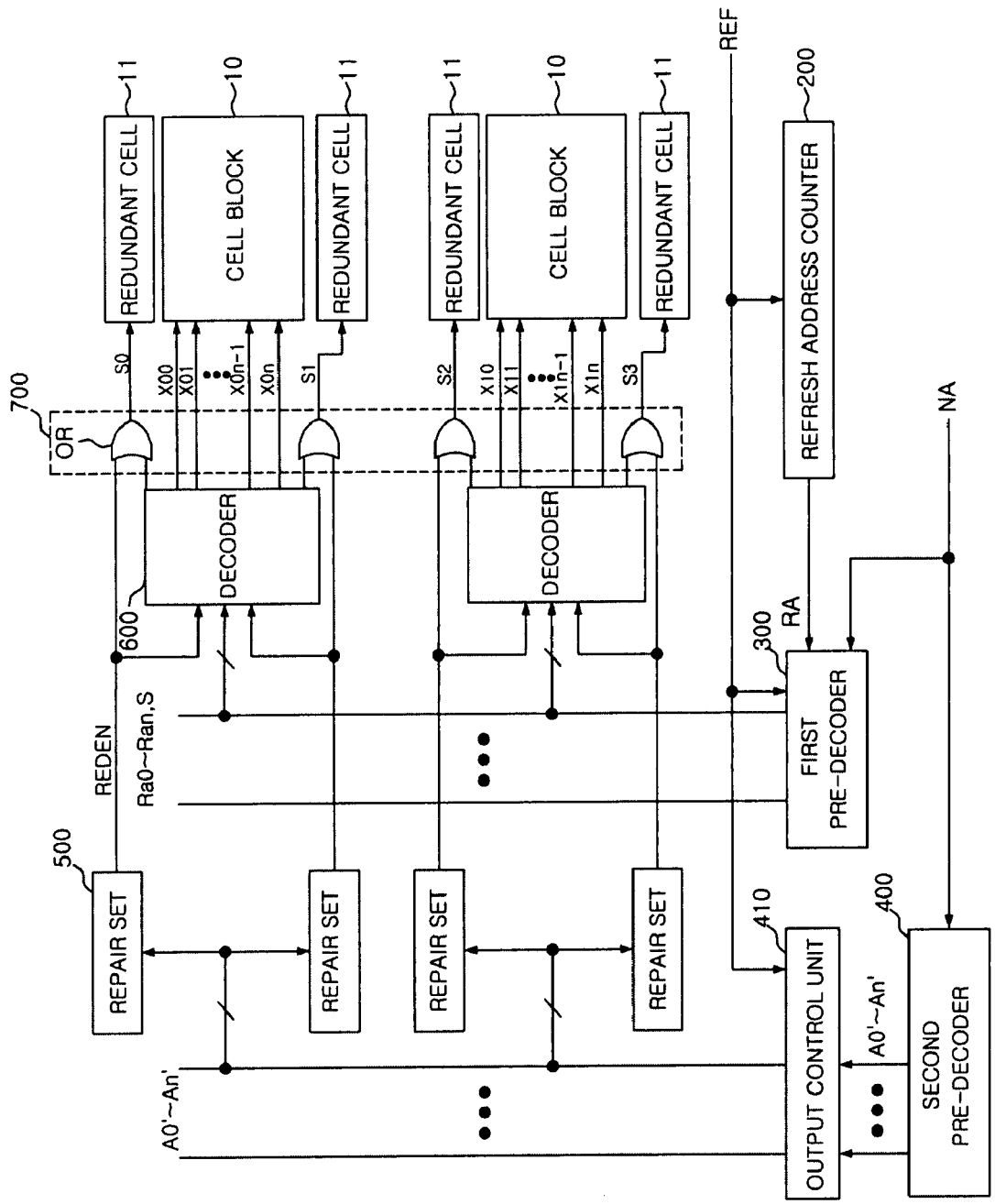
FIG. 3 is a block diagram illustrating a structure of a semiconductor memory apparatus according to an embodiment of the present invention.

As shown in FIG. 3, a semiconductor memory apparatus according to an embodiment of the present invention includes cell blocks 10, each of which includes a plurality of general cells, redundant cells 11 for repairing defective cells among the general cells, a refresh address counter 200 that counts a refresh address RA, a first pre-decoder 300 that pre-decodes the refresh address RA or a normal address NA, a second pre-decoder 400 that pre-decodes the normal address NA, an output control unit 410 that blocks output of the second pre-decoder 400 according to input of a refresh signal REF, repair sets 500 that determine whether addresses, which are output by the second pre-decoder 400, are repaired or not, decoders 600 that decode output of the first pre-decoder 300 and output the decoded result to the cell blocks 10 according to output of the repair sets 500, and a signal combining unit 700 that combines the output of the repair sets 500 and the output of the decoders 600 and outputs the combined result to the redundant cells 11.

The refresh address counter 200 performs a refresh address counting operation so as to make all of the general cells of the cell blocks 10 and the redundant cells 11 active according to the predetermined order. That is, the refresh address counter 200 counts addresses for sequentially making the general cells active, and then addresses for sequentially making the redundant cells 11 active. The refresh address counter 200 repeats such a refresh address counting operation.

The first pre-decoder 300 pre-decodes the refresh address RA, the normal address NA, and the refresh signal REF. Unlike the related art, the first pre-decoder 300 according to an embodiment of the present invention needs to decode addresses so as to make the general cells and the redundant cells 11 active. Therefore, the first pre-decoder 300 uses the refresh signal REF as an additional address.

According to the embodiment of the present invention, a repair determination is not performed by the repair sets 500 during a refresh operation. Therefore, since the second pre-decoder 400 does not need to receive the refresh address RA, the second pre-decoder 400 only receives the normal address NA and pre-decodes addresses for the repair determination only during a normal operation.

Figure 4:
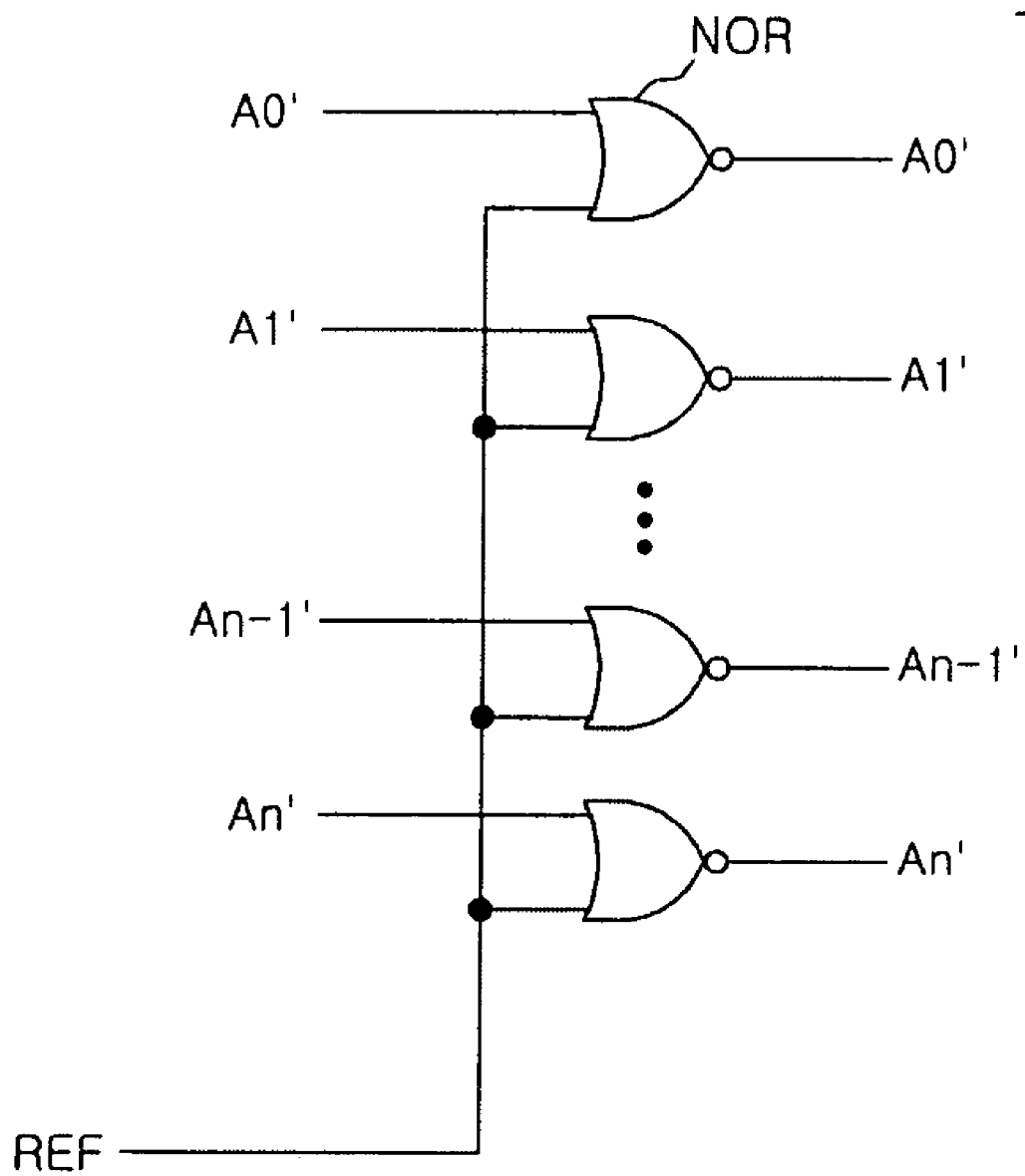
FIG. 4 is a circuit diagram illustrating a structure of an output control unit of FIG. 3.

As shown in FIG. 4, the output control unit 410 includes a plurality of logic elements that block output of the second pre-decoder 400 when the refresh signal REF is input, that is, NOR gates NOR.

Figure 5:
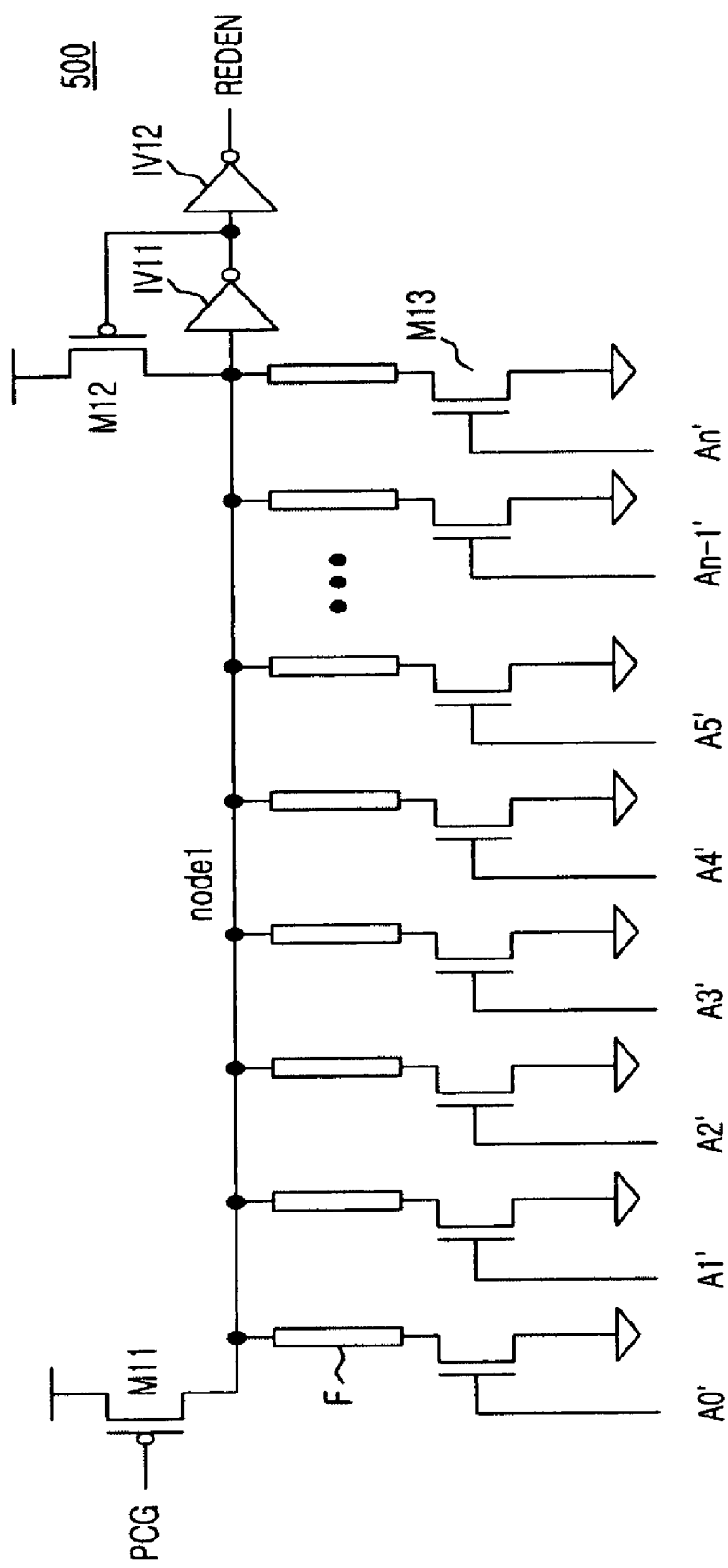
FIG. 5 is a circuit diagram illustrating a structure of a repair set of FIG. 3.

As shown in FIG. 5, each of the repair sets 500 includes a first transistor M1 that has a gate receiving a precharge signal PCG and a source connected to a power supply terminal, a plurality of second transistors M13 that have gates individually receiving addresses A0' to An', which are decoded by the second pre-decoder 400, a plurality of fuses F, each of which has one end connected to a drain of the first transistor M11 and the other end connected to a source of each of the plurality of second transistors M13, first and second inverters IV11 and IV12, each of which is connected to one end of the final fuse F, and a third transistor M12 that has a gate receiving output of the first inverter IV11, a source connected to the power supply terminal, and a drain connected to an input terminal of the first inverter IV11.

The repair set 500 precharges a node 1 with a high level according to the precharge signal PCG.

A latch that is formed of the first inverter IV11 and the third transistor M12 receives a level of the node 1 and maintains the redundant enable signal REDEN at a high level.

When the addresses A1' to An' that are decoded by the second pre-decoder 400 are not repaired addresses, the corresponding fuses F are not cut off. Therefore, the node 1 is connected to a ground so as to become a low level.

The latch that is formed of the first inverter IV11 and the third transistor M12 receives the level of the node 1 and disables the redundant enable signal REDEN to a low level.

Meanwhile, when the addresses A0' to An' that are decoded by the second pre-decoder 400 are repaired addresses, since the corresponding fuses F are cut off, and thus the node 1 becomes a high level.

The latch that is formed of the first inverter IV11 and the third transistor M12 receives a high level of the node 1 and outputs the redundant enable signal REDEN at a high level.

The signal combining unit 700 includes a logic element that performs an OR operation on the output of the repair set 500 and the output of the decoder 600 and outputs the result. That is, the signal combining unit 700 includes an OR gate OR.

A method of controlling the semiconductor memory apparatus having the above-described structure according to an embodiment of the present invention will be described as follows.

First, a process of making cells active during a normal operation will be described as below.

During a normal operation, that is, when the normal address NA is input according to a read or write operation, each of the first pre-decoder 300 and the second pre-decoder 400 pre-decodes the normal address NA and outputs the pre-decoded normal address NA.

Each of the repair sets 500 enables a redundant enable signal REDEN at a high level when the address, which is output by the second pre-decoder 400, is a repaired address, and otherwise, the repair set 500 disables the redundant enable signal REDEN at a low level.

Meanwhile, each of the decoders 600 decodes addresses Ra0 to Ran, S, which are output by the first pre-decoder 300, and outputs the decoded addresses Ra0 to Ran, S to each of the cell blocks 10 when the redundant enable signal REDEN is disabled.

The general cells corresponding to addresses X00 to X1n, which are output by each of the decoders 600, are activated.

Meanwhile, when the redundant enable signal REDEN is enabled, the output of the addresses X00 to X1n is blocked in each of the decoders 600, and the redundant enable signal REDEN serving as addresses S0 to S3 is output to the redundant cells 11, which are used to repair the defective cells, through the signal combining unit 700.

The redundant cells 11 that correspond to the addresses S0 to S3 become active.

Next, a process of making cells active during a refresh operation will be described.

When the refresh signal REF is enabled, the refresh address counter 200 outputs a refresh address RA so as to sequentially make the general cells and the redundant cells 11 active.

When the refresh address RA is input, the first pre-decoder 300 pre-decodes the refresh address RA and a refresh signal REF, which is an additional address, and outputs the pre-decoded refresh address RA and refresh signal REF to the decoders 600.

In the output control unit 410, since the refresh signal REF is enabled at a high level, output of each of the NOR gates NOR becomes a low level. Therefore, the output control unit 410 fixes signal lines, through which addresses A0' to An' are output from the second pre-decoder 400 to each of the repair sets 500, at a low level.

The second pre-decoder 400 stops its operation because input of each of the addresses A0' to An' is blocked by the output control unit 410.

Since the second pre-decoder 400 does not operate, the repair sets 500 also stop the operation thereof.

The second pre-decoder 400 only receives the normal address NA, not the refresh address RA.

A value of the normal address NA shows no change while the refresh operation is being performed, and individual bits of the normal address NA have, for example, logical values '0'. Even when the individual bits of the normal address NA have logical values '0', since any one of the outputs of the second pre-decoder 400 outputs a logical value '1', the repair set 500 may operate according to the logical value '1'. Therefore, the operation of each of the repair sets 500 is completely blocked by causing each of the addresses A0' to An', which are supplied to the repair sets 500 by the output control unit 410, to have a logical value '0'.

The decoder 600 decodes the outputs Ra0 to Ran, S of the first pre-decoder 300, such that the general cells are sequentially activated, and then redundant cells 11 are sequentially activated.

While the refresh operation is performed, the repair sets 500 do not operate. Therefore, the decoders 600 directly perform the active operation for the refresh operation of the general cells and the redundant cells 11. Since the number of the redundant cells 11 is much smaller than the number of the general cells, when the refresh operation on both the general cells and the redundant cells 11 is performed regardless of whether the cells are repaired or not, power consumption can be remarkably reduced as compared when the repair sets 500 make the redundant cells 11 active during the refresh operation according the related art.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

As described above, according to the semiconductor memory apparatus and the method of controlling the same according to the embodiment of the present invention, since the structure that determine whether the cells are repaired or not do not operate during the refresh operation, a refresh current can be minimized, and performance of the semiconductor memory apparatus can be remarkably improved due to reduction of the power consumption.

What is claimed is:

1. A semiconductor memory apparatus that has general cells and redundant cells for repairing defective cells among the general cells, the apparatus comprising:
   repair sets configured to determine whether general cells corresponding to input addresses are repaired or not and to output signals to activate the redundant cells;
   decoding units configured to decode a refresh address or a normal address to output decoded refresh or normal addresses and activate the general cells or the redundant cells according to the decoded refresh address or normal address; and
   a control unit configured to perform control such that the decoded refresh or normal addresses, which are output by the decoding units, are not input to the repair sets according to a control signal.

2. The semiconductor memory apparatus of claim 1, wherein the decoding units include:
   a first decoding unit configured to decode the refresh address or the normal address to produce decoded refresh address or normal address;
   second decoding units configured to decode the decoded refresh address or normal addresses output of the first decoding unit and to output signals activate the general cells or the redundant cells based thereon; and
   a third decoding unit configured to decode the normal address to produce the decoded normal address and output the decoded normal address to the repair sets.

3. The semiconductor memory apparatus of claim 1, further comprising:
   a refresh address counting unit configured to count the refresh address.

4. The semiconductor memory apparatus of claim 3, wherein the refresh address counting unit counts the refresh address such that all of the general cells and the redundant cells that replace the general cells can be selected.

5. The semiconductor memory apparatus of claim 3, wherein the refresh address counting unit counts the refresh address such that after all of the general cells are selected, the redundant cells that replace the general cells can be selected.

6. The semiconductor memory apparatus of claim 2, wherein the first decoding unit receives an additional address as well as the refresh address and the normal address and also decodes the additional address.

7. The semiconductor memory apparatus of claim 6, wherein a refresh signal is the additional address.

8. The semiconductor memory apparatus of claim 2, wherein the control unit includes a plurality of logical elements that have first input terminals individually receiving outputs of the third decoding unit and second input terminals commonly receiving a refresh signal.

9. The semiconductor memory apparatus of claim 2, wherein each of the repair sets includes:
   a first transistor configured to have a source connected to a power supply terminal and a drain;

a plurality of second transistors, each of which has a gate receiving a respective decoded normal address output of the third decoding unit, the output related to the redundant cells corresponding to the second transistors; and a plurality of fuses, each of which has one end connected to the drain of the first transistor and an other end connected to a respective one of the plurality of second transistors.

10. The semiconductor memory apparatus of claim 2, further comprising:

a signal combining unit configured to combine the signals output of the repair sets and the signals output of the second decoding units and output a combined result to the redundant cells.

11. The semiconductor memory apparatus of claim 10, wherein the signal combing unit includes logical elements configured to perform OR operations on the signals output of the repair sets and the signals output of the second decoding units and output a result.

12. A method of controlling a semiconductor memory apparatus configured to have redundant cells, the method comprising:

determining whether a refresh signal is input or not;

causing addresses to be input to the repair sets and the decoders when the refresh signal is not input, such that an active operation is performed on the general cells and/or the redundant cells; and blocking input of the address to the repair sets when the refresh signal is input and causing the addresses to be input to the decoders, such that an active operation is performed on the general cells and the redundant cells.

13. The method of claim 12, wherein the active operation on the general cells or the redundant cells is performed when the normal addresses are input.

14. The method of claim 12, wherein the active operation on the general cells and the redundant cells is performed when refresh addresses are input.

15. The method of claim 14, wherein the refresh addresses are input such that all of the general cells and the redundant cells can be activated according to a predetermined order.

16. The method of claim 14, wherein the refresh addresses are input according to a predetermined order in which after all of the general cells are activated and the redundant cells are activated.

17. A method of controlling a semiconductor memory apparatus configured to have redundant cells, the method comprising:

determining, when a normal address is input, whether the normal address input is repaired or not, and performing an active operation on the general cells or the redundant cells, which corresponds to a result of decoding the normal address input, according to a determination result; and causing a repair determination not to be performed when a refresh address is input, decoding the refresh address, and performing an active operation on both the general cells and the redundant cells according to a predetermined order.

18. The method of claim 17, wherein in the decoding of the refresh address, an additional address as well as the refresh address is decoded.

19. The method of claim 18, wherein a refresh signal is used as the additional address.

20. The method of claim 17, further comprising:

stopping the operation of structures, which perform the repair determination, by using the refresh signal.

* * * * *